United States Patent [19]

Jules

[11] 4,074,191
[45] Feb. 14, 1978

[54] FREQUENCY MEASURING DEVICE FOR TELECOMMUNICATION SYSTEMS

[76] Inventor: Jacques M. Jules, 1, Allee de Bellevue, Maintenon, France, 28130

[21] Appl. No.: 755,945

[22] Filed: Dec. 30, 1976

[30] Foreign Application Priority Data

Dec. 30, 1975 France .............................. 75 40113

[51] Int. Cl.² .......................................... G01R 23/14
[52] U.S. Cl. .................................. 324/79 R; 325/363; 328/134
[58] Field of Search ................ 324/78 D, 78 Z, 79 R, 324/79 D; 307/295; 328/134; 325/363, 431, 455

[56] References Cited

U.S. PATENT DOCUMENTS

| | | | |
|---|---|---|---|
| 3,509,476 | 4/1970 | Roth | 328/134 |
| 3,660,763 | 5/1972 | Parzen | 325/363 |
| 3,838,338 | 9/1974 | Khoury | 324/79 D |

*Primary Examiner*—Rudolph V. Rolinec
*Assistant Examiner*—Michael J. Tokar

[57] ABSTRACT

A device capable of being operated under the control of a programmer for rapidly measuring the differences between the actual values of a plurality of transmitted signal frequencies and their assigned values. It comprises a constant frequency local oscillator, a modulator fed from said oscillator and from a signal the actual frequency of which is to be determined, a bandpass filter fed from the output of said modulator, another local oscillator producing a constant frequency, and means for measuring the frequency difference between said other oscillator and the output frequency of the filter. Arrangements are provided for displaying the measured frequency difference values in digital form.

4 Claims, 2 Drawing Figures

FREQUENCY MEASURING DEVICE FOR TELECOMMUNICATION SYSTEMS

BACKGROUND OF THE INVENTION

1. Field of the Invention

The present invention relates to a frequency device and more particularly to a device for measuring the difference between the actual value of at least one frequency of a periodic electrical signal and the nominal value assigned to the said frequency.

Operation of telecommunication circuits involves controlling numerous frequencies, particularly modulation carrier current frequencies and repeater identification-signal frequencies. The said frequencies are mixed in a spectrum of various modulations.

2. Objects of the Invention

A first object of the invention is to provide a device for monitoring the frequency level which makes it possible to extract, from the said spectrum, a sufficiently narrow frequency band so that only one frequency to be monitored is included in it, and to rapidly and accurately measure the difference between the actual level of the said frequency and a nominal value assigned to it.

Another object of the invention is to provide a monitoring device of the type described above, which makes it possible to successively effect the said measurements of frequency differences in a mulitplicity of frequencies in a rapid and accurate manner.

Another object of the invention is to provide a device for automatically carrying out the said measurements.

SUMMARY OF THE INVENTION

According to the present invention there is provided a device for measuring a positive or negative difference $\Delta f$ between the real value $(f + \Delta f)$ and the nominal value $f$ of at least one frequency carried by way of a telecommunication line, comprising:

a first local oscillator controlled by a master oscillator and producing a frequency value $(f+f_o)$, $f_o$ being a predetermined frequency value added to or subtracted from that of the frequency $f$;

a balanced modulator, one input of which is connected to the said line and the other input of which is connected to the output of the first local oscillator, the said modulator then producing, within its limits of possible modulation, the frequency term:

$(f+f_o) - (f+\Delta f) = f_{o - \Delta f}$;

a bandpass filter connected to the output of the modulator, the band limits of the bandpass filter being determined so that said filter transmits only the said term $(f_0 - \Delta f)$, a second local oscillator controlled by the said master oscillator and producing a frequency of value $f_o$, and means for measuring the algebraic difference between the frequency produced by the said second local oscillator and the frequency transmitted by the filter, the said difference being equal to the value of the difference $\Delta f$.

A first advantage of the device according to the invention is that suitable adjusting of the level and the limits of the frequencies in the filter passband ensures that the frequency to be monitored is the only one actually selected in the spectrum conveyed by the telecommunication line.

A second advantage is that a possible phase shift of the master oscillator does not affect measurement accuracy since the frequencies at the inputs of the measuring means are affected to the same extent by the same shift.

Advantageously, the second local oscillator is a digital oscillator and the means for measuring the said difference in the frequencies comprises:

a frequency multipier whose input is connected to the output of the filter, a frequency multiplier whose input is connected to the multiplier, finally, an up and down counter, one nut of which, for example its up input, is connected to the output of the second local oscillator, and its other input is connected to the output of the frequency meter.

The invention thus permits:

on the one hand, to effect an accurate and rapid measurement, the duration of which is well below one second, and, on the other hand, to measure and to indicate the level of the frequency differences in a numerical form, thereby allowing easy displaying and recording of the measurements.

According to another embodiment of the invention, the first local oscillator is a variable-frequency oscillator and has a frequency-control input. The invention also permits to obtain successive measurements of the frequency differences $\Delta f_1$, $\Delta f_2$, $\Delta f_3$, etc. of the actual frequency values $f_1+\Delta f_1$, $f_2+\Delta f_2$, $f_3+\Delta f_3$ with respect to their nominal values $f_1, f_2, f_3$, etc.

The sole adjusting operation comprises assigning successive frequencies $f_1+f_o$, $f_2+f_o$, $f_3+f_o$, etc. to the said first local oscillator. The measurements are automatically made if the frequency control input is connected to the output of a programmer successively generating, in accordance with a predetermined program, control signals corresponding to the said successive frequencies.

The invention will now be described in more detail, by way of example only, with reference to the accompanying drawings, in which:

DESCRIPTION OF THE PREFERRED EMBODIMENTS

Figure 1:
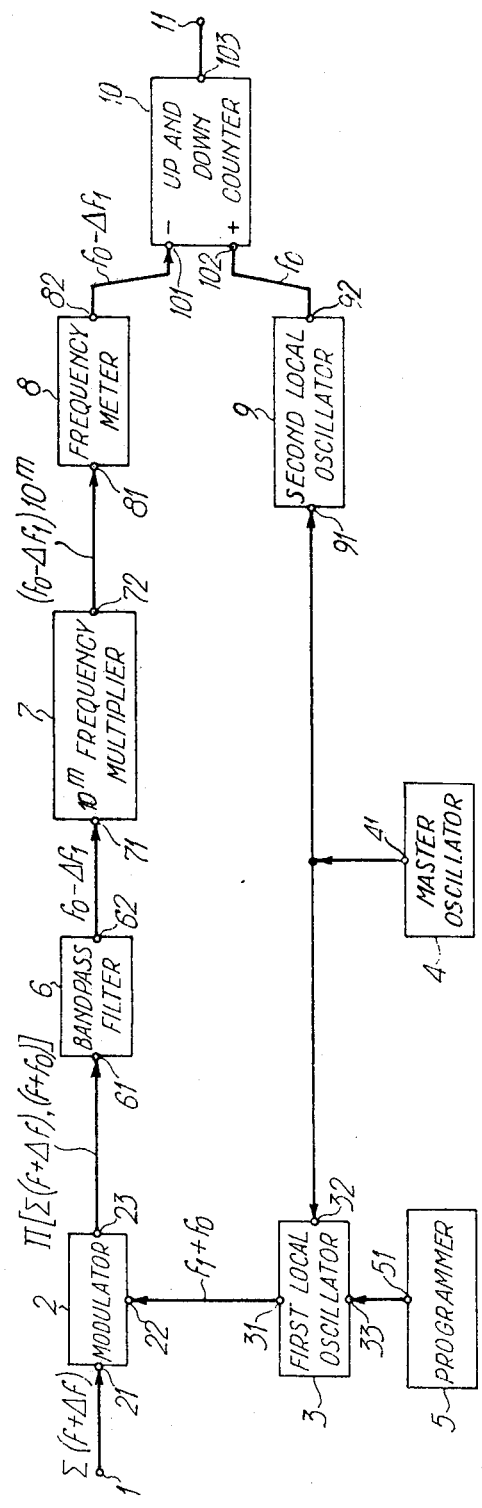
FIG. 1 is a block diagram showing an embodiment of a device according to the invention for automatically monitoring frequencies conveyed by a telecommunication line.

First let us consider FIG. 1. A line 1 conveys a multiplicity of frequencies having respective nominal values $f_1, f_2, f_3$, etc., and actual values $f_1+\Delta f_1, f_2+\Delta f_2, f_3+\Delta f_3$, etc. The differences $\Delta f_1, \Delta f_2, \Delta f_3$ can be either positive or negative. In FIG. 1, such multiplicity is represented by the generic symbol $\epsilon(f+\Delta f)$. A balanced modulator 2 has its input 21 connected to the line 1 and its input 22 connected to the output 31 of a first local oscillator 3. The latter is controlled by a master oscillator 4 (a quartz oscillator) the output 41 of which is connected to a synchronizing input 32 of the local oscillator 3 which also has a frequency-control input 33 connected to an output 51 of a programmer 5.

The programmer 5 successively generates control signals so that the oscillator 3 successively applies frequencies of values $f_1+f_o, f_2+f_o, f_3 30 f_o$, etc. to the input 22 of the modulator 2. The value $f_o$ is a constant term which is substantially smaller than the frequency intervals separating the nominal values $f_1$ and $f_2$, $f_2$ and $f_3$, etc.

Depending on the order determined by the program, the modulator then generates, at its output 23, a succession of modulation products $\pi_1$, $\pi_2$, etc., the first of which being the result of intermodulation of the frequency $f_1 + \Delta f_1$ and of the frequency $f + f_o$, the second being the result of intermodulation of the frequency $f_2 + \Delta f_2$ and the frequency $f_2 + f_o$, etc. These successive products, which are indicated by $\pi | \epsilon(f + \Delta f_1), (f + f_o) |$ in the drawings, comprise the terms:

$$f_1 + f_o - (f_1 + \Delta f_1) = f_o - \Delta f_1,$$

$$f_2 + f_o - (f_2 + \Delta f_2) = f_o - \Delta f_2, \text{ etc.}$$

It will be seen that these terms are constant except for the differences $\Delta f_1$, $\Delta f_2$, etc. which are very small with respect to the frequency $f_o$. This allows a constant passband of small width centered on the frequency $f_o$ to be applied to the filter 6, the input 61 of which is connected to the output 23 of the modulator 2, and thus it is possible to successively select with certainty the terms of the orders which successively correspond to the various frequencies to be monitored.

In proportion as the terms $f_o - \Delta f_1$, $f_o - \Delta f_2$, etc. become available at the output 62 of the filter 6, they are measured by a circuit comprising a frequency multiplier 7, the input 71 of which is connected to the output 62 of the filter 6, and a digital frequency meter (counter-frequency meter) 8, the output 81 of which is connected to the output 72 of the said multiplier. For example, if one desires to measure each term with an accuracy of 1 hertz while carrying out each measurement in $10^{-m}$ seconds (e.g. 1/100 seconds), the coefficient of the multiplier is fixed at $10^{-m}$ (e.g. $10^2$) and the computation time for the frequency meter 8 is fixed at $10^{-m}$ seconds (e.g. $10^{-2}$). The digital signals which successively become available at the output 82 of the frequency meter 8 then correspond to the successive values of the terms $f_o - \Delta f_1$, $f_o - \Delta f_2$, etc.

A second local oscillator 9 has its synchronization input 91 connected to the input 41 of the master oscillator 4. The oscillator 9 is a digital oscillator operating at the frequency $f_o$. The output bits from the frequency meter 8 are applied to the down input 101 of an up and down counter 10. The output bits from the oscillator 9 are applied to the up input 102 of the same counter. The latter then generates, on its output 103, digital signals successively corrsponding to the values: $f_o - (f_o - \Delta f_1)$, $f_o - (f_o - \Delta f_2)$, etc., i.e. corresponding to the values of the differences $f_1$, $\Delta f_2$, etc. Such signals which are available at the output terminal 11 of the device of FIG. 1 can be displayed, stored, printed, etc. by means of devices not shown.

Figure 2:
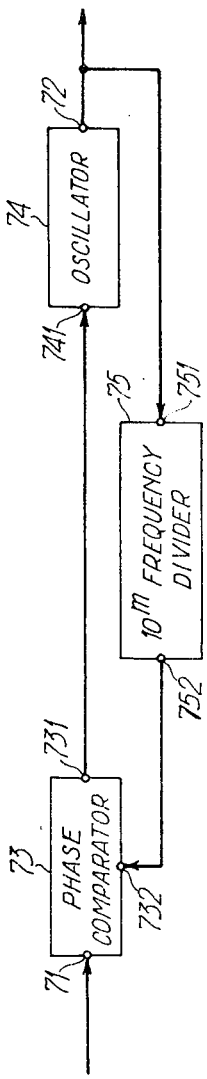
FIG. 2 is a diagram showing an advantageous embodiment of a circuit according to the diagram of FIG. 1.

All circuits or components 2, 3, 4, ... 8, 9, 10 included in the diagram of FIG. 1 are well known to persons skilled in the art. It is then useless to describe their structure. FIG. 2 is a diagram illustrating an embodiment of the frequency multiplier 7. Such a diagram is known per se; however, its application to the device according to the present invention ensures particular advantages.

The frequency multiplier of FIG. 2 comprises an oscillator controlled by a frequency division phase-interlocking loop. It comprises:

a phase comparator 73 which generates, on its output 731, a voltage proportional to the phase difference of the alternate signals applied to the input 71 (see FIG. 1) and to the other input 732, a controlled oscillator 74 to the control input 741 of which there is applied the voltage at the output 731 of the comparator 73, and whose output is the output 72 of FIG. 1, a frequency divider 75 arranged to divide the frequency at the output 72 (which is connected to its input 751) by a coefficient equal to the desired multiplication coefficient (e.g. $10^m$), and to apply the divided frequency from its output 752 to the input 732 of the comparator 73.

It is known that, when the loop comprising the comparator 73, the oscillator 74 and the divider 75 is in an equilibrium state, the output frequency of the oscillator 72 is synchronized with the signal applied to the input 71 with negligible phase difference. It is also known that the time constant $t$ of such a loop is obtained by the relationship:

$$t = k/2\pi \, ab$$

where $k$ is the multiplication factor (i.e. the factor of the divider 75), $a$ the proportionality coefficient between the voltage $v$ applied to the input 741 and the frequency variation $\Delta f$ imposed on the oscillator 74 ($\Delta f = av$), and $b$ the proportionality coefficent between the output voltage of the comparator 73 and the phase difference of the input signals.

Such a time constant can be reduced to a duration smaller than a millisecond. Thus, the multiplier of FIG. 2 makes it possible for the device of FIG. 1 to effect a great number of measurements in a very short time. Obviously, it is necessary that the duration of the measurement periods imposed by the programmer 5 as well as the duration of the intervals between the periods be compatible with the said time constant. The same applies to the computing duration of the frequency meter 8. This can be very easily obtained by means of synchronization connections which have not been shown in FIG. 1.

The circuits according to the diagram of FIG. 1 can be notably simplified in practice, if the device according to the invention is designed to monitor frequencies arranged according to an arithmetical progression, as it is the case with telecommunications where the frequencies, expressed in hertz, are multiples of integer powers of 10; in other words they can be expressed by values having the form k·$10^r$, where $k$ and $r$ are positive integers (e.g. 106 kHz = $106 \cdot 10^3$ hertz). The intervals which separate each frequency from its adjacent frequency (in other words the common difference in the arithmetical progression) are also (expressed in hertz) multiples of integer powers of 10, i.e. ($s \cdot 10^r$) (e.g. 3 or 4 kHz).

In these conditions, the first local oscillator 3 and the second local oscillator 9 can comprise frequency synthesisers of known type which generate multiple frequencies of $10^r$ hertz, the first oscillator generating, upon control of the programmer 5, successive signals in an increasing or decreasing progression the common difference of which is $s \cdot 10^4$ hertz.

For example, if frequencies having nominal values: $f_1 = 103$ kHz, $f_2 = 106$ kHz, $f_3 = 109$ kHz, are to be monitored, the oscillator 3 successively generates the frequencies:

$$f_1 + f_o = 113 \text{ kHz},$$

$f_2 + f_o = 116$ kHz, $f_3 + f_o = 119$ kHz.

The oscillator 3 generates the frequency 10 kHz on which the filter 6 is centered, and the multiplier 7 generates the frequency $(f_o - \Delta f)10^2$ whose value is close to 1 mHz.

Finally, it will be noted that no hypothesis was made about the nature of the telecommunication line monitored by the device according to the invention. The said line could equally comprise an underground or submarine co-axial cable or a radio connection.

What I claim is:

1. A device for measuring a positive or negative difference $\Delta f$ between the actual value $(f + \Delta f)$ and the nominal value $f$ of at least one frequency carried by way of a telecommunication line, comprising:
   a first local oscillator controlled by a master oscillator and producing a frequency value $(f + f_o)$, $f_o$ being a constant predetermined frequency value which may be added to or subtracted from the frequency $f$;
   a balanced modulator, one input of which is connected to the said line and the other input of which is connected to the output of the first local oscillator, the said modulator then producing, among its modulation products, the frequency term:

$(f + f_o) - (f + \Delta f) = f_o - \Delta f;$ a bandpass filter connected to the output of the modulator, the band limits of the said bandpass filter being determined so that the said filter transmits only the said term $(f_o - \Delta f)$;
   a second local oscillator controlled by the said master oscillator and producing a frequency of value $f_o$, and
   means for measuring the algebraic difference between the frequency produced by the said second local oscillator and the frequency transmitted by the filter, the said difference being equal to the value of the difference $\Delta f$.

2. A device as claimed in claim 1, wherein the second local oscillator is a digital oscillator and the means for measuring the difference comprises:
   a frequency multiplier the input of which is connected to the output of the filter;
   a frequency meter (counter-frequency meter) whose input is connected to the output of the multiplier, and
   a differential digital counter having one input connected to the output of the digital oscillator and its other input connected to the output of the frequency meter.

3. A device as claimed in claim 1, wherein the first local oscillator is a variable-frequency oscillator and comprises a frequency control input and wherein a programmer successively generates frequency-control signals to be applied to the said frequency control input.

4. A device as claimed in claim 2, wherein the frequency multiplier comprises a phase comparator a first input of which is connected to the output of the filter, an oscillator having a frequency control input connected to the output of the phase comparator and its output connected to the input of the frequency meter, and a frequency divider the input of which is connected to the output of the latter said oscillator and the output of which is connected to the second input of the phase comparator.

* * * * *